United States Patent
Fukumaki

(10) Patent No.: US 10,590,532 B2
(45) Date of Patent: Mar. 17, 2020

(54) SEMICONDUCTOR MANUFACTURING APPARATUS AND METHOD OF MANUFACTURING SEMICONDUCTOR DEVICE

(71) Applicant: TOSHIBA MEMORY CORPORATION, Minato-ku (JP)

(72) Inventor: Naomi Fukumaki, Yokkaichi (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 15/891,500

(22) Filed: Feb. 8, 2018

(65) Prior Publication Data

US 2019/0071774 A1 Mar. 7, 2019

(30) Foreign Application Priority Data

Sep. 4, 2017 (JP) .................................. 2017-169636

(51) Int. Cl.
| | |
|---|---|
| H01L 21/67 | (2006.01) |
| C23C 16/455 | (2006.01) |
| H01J 37/32 | (2006.01) |
| C23C 16/44 | (2006.01) |
| G01F 7/00 | (2006.01) |
| G05D 7/06 | (2006.01) |

(52) U.S. Cl.
CPC .... *C23C 16/45502* (2013.01); *C23C 16/4404* (2013.01); *C23C 16/45561* (2013.01); *G01F 7/005* (2013.01); *G05D 7/0635* (2013.01); *H01J 37/32449* (2013.01); *H01L 21/67017* (2013.01); *H01L 21/67253* (2013.01)

(58) Field of Classification Search
CPC .......... C23C 16/45502; C23C 16/4404; C23C 16/45561; G05D 7/00; H01L 21/67017; H01L 21/67253; H01J 37/32449; G01F 7/005

See application file for complete search history.

(56) References Cited

U.S. PATENT DOCUMENTS

| | | | |
|---|---|---|---|
| 8,128,728 B2 | 3/2012 | Tsangaris et al. | |
| 2008/0305014 A1* | 12/2008 | Honda | G05D 7/0641 422/111 |
| 2014/0196664 A1 | 7/2014 | Johnson et al. | |

FOREIGN PATENT DOCUMENTS

| | | |
|---|---|---|
| JP | 11-354863 | 12/1999 |
| JP | 2005-142377 | 6/2005 |
| JP | 2009-536097 | 10/2009 |
| JP | 2014-159630 | 9/2014 |

\* cited by examiner

*Primary Examiner* — Thanh T Nguyen
(74) *Attorney, Agent, or Firm* — Oblon, McClelland, Maier & Neustadt, L.L.P.

(57) ABSTRACT

In one embodiment, a semiconductor manufacturing apparatus includes first and second tanks configured to store a gas fed from a gas feeder. The apparatus further includes a chamber configured to process a wafer by using the gas fed from the gas feeder, the first tank or the second tank. The apparatus further includes a controller configured to control feeding of the gas to the first tank, the second tank and the chamber.

10 Claims, 5 Drawing Sheets

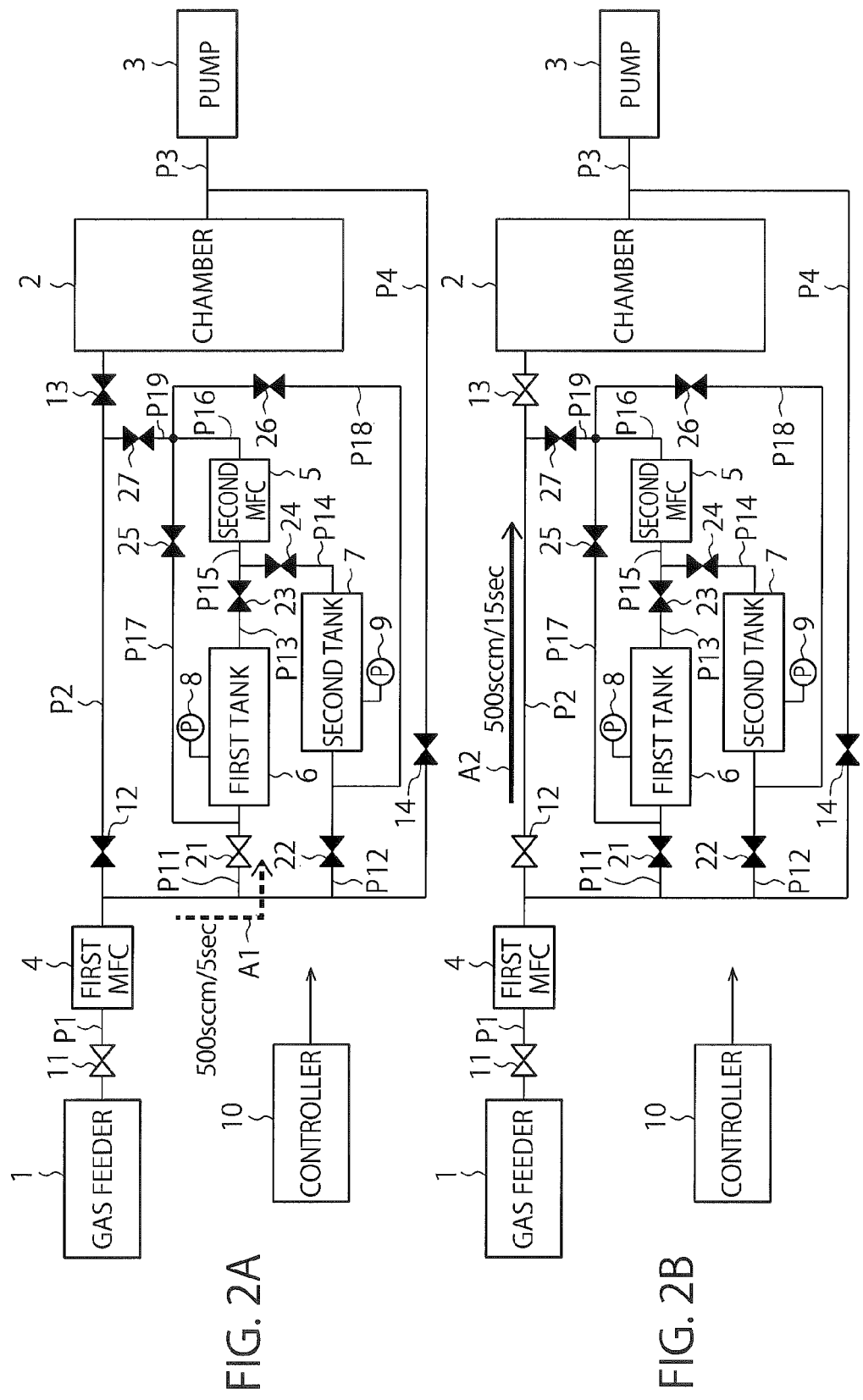

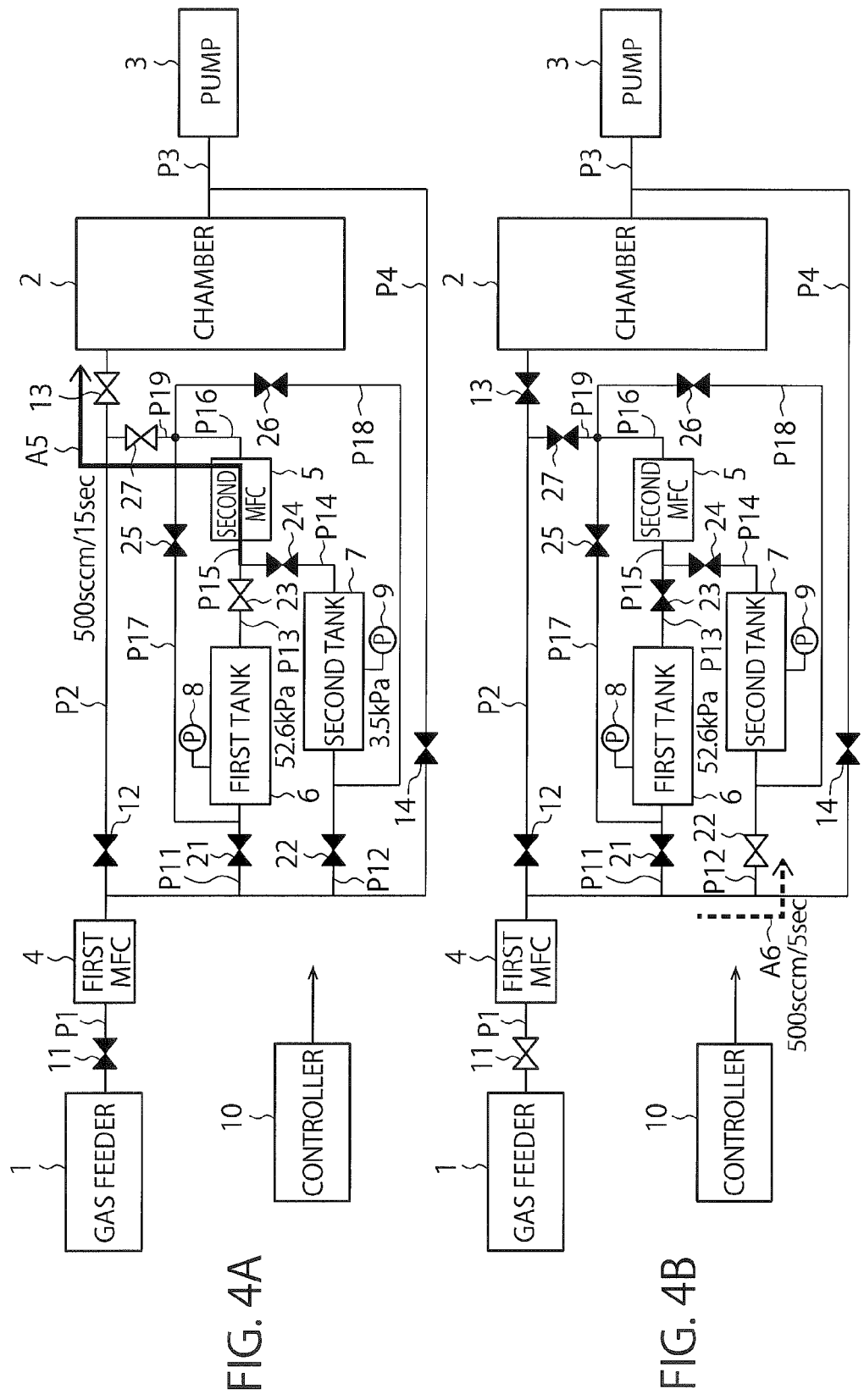

SEMICONDUCTOR MANUFACTURING APPARATUS AND METHOD OF MANUFACTURING SEMICONDUCTOR DEVICE

CROSS REFERENCE TO RELATED APPLICATION

This application is based upon and claims the benefit of priority from the prior Japanese Patent Application No. 2017-169636, filed on Sep. 4, 2017, the entire contents of which are incorporated herein by reference.

FIELD

Embodiments described herein relate to a semiconductor manufacturing apparatus and a method of manufacturing a semiconductor device.

BACKGROUND

When a wafer is to be processed in a chamber with a gas, the gas may be fed from a gas feeder to bypass the chamber so as not to be fed to the chamber. For example, when a mass flow controller (MFC) is disposed between the gas feeder and the chamber, the MFC is stabilized by feeding the gas to the MFC before starting the processing of the wafer. In this case, because the gas that has passed through the MFC bypasses the chamber, the gas is wasted without making a contribution to the processing of the wafer.

BRIEF DESCRIPTION OF THE DRAWINGS

FIGS. 2A to 5B are diagrams illustrating operations of the semiconductor manufacturing apparatus of the first embodiment.

DETAILED DESCRIPTION

Embodiments will now be explained with reference to the accompanying drawings.

In one embodiment, a semiconductor manufacturing apparatus includes first and second tanks configured to store a gas fed from a gas feeder. The apparatus further includes a chamber configured to process a wafer by using the gas fed from the gas feeder, the first tank or the second tank. The apparatus further includes a controller configured to control feeding of the gas to the first tank, the second tank and the chamber.

First Embodiment

Figure 1:
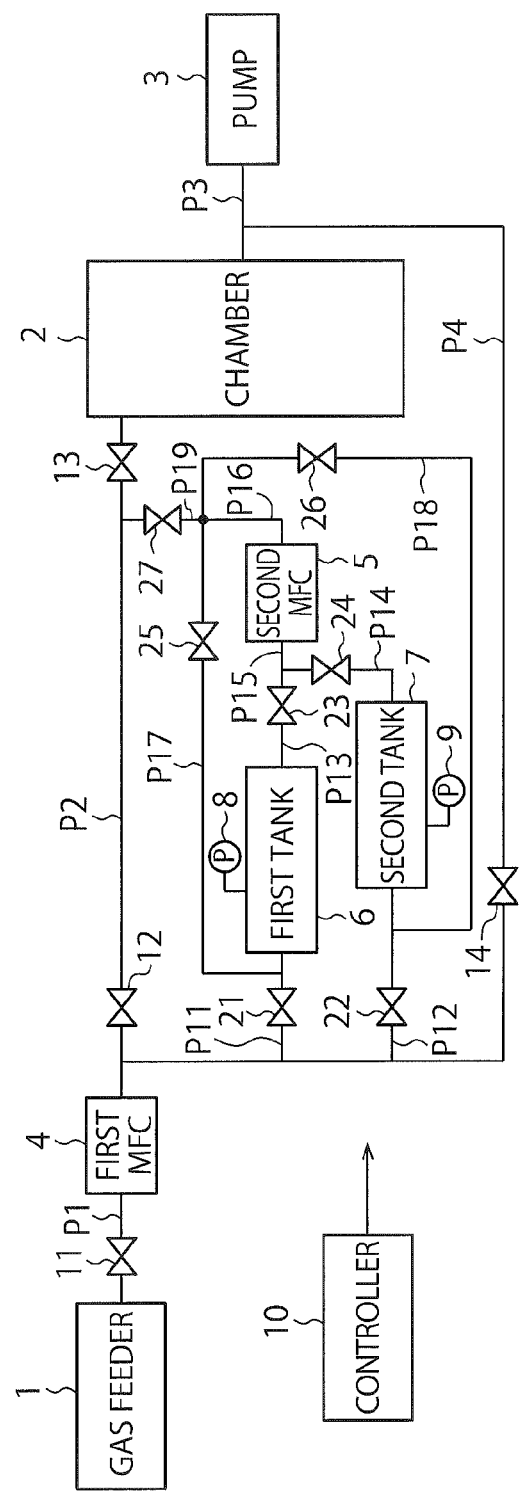
FIG. 1 is a schematic diagram illustrating a configuration of a semiconductor manufacturing apparatus of a first embodiment.

FIG. 1 is a schematic diagram illustrating a configuration of a semiconductor manufacturing apparatus of a first embodiment.

The semiconductor manufacturing apparatus in FIG. 1 includes a gas feeder 1, a chamber 2, a pump 3, a first MFC 4, a second MFC 5, a first tank 6, a second tank 7, a first measuring instrument 8, a second measuring instrument 9 and a controller 10. The first MFC 4 is an example of a first flow rate controller, and the second MFC 5 is an example of a second flow rate controller.

The semiconductor manufacturing apparatus in FIG. 1 further includes a first feeding valve 11, a second feeding valve 12, a third feeding valve 13, a bypass valve 14, a first inlet valve 21, a second inlet valve 22, a first outlet valve 23, a second outlet valve 24, a first transfer valve 25, a second transfer valve 26 and an introduction valve 27. The valves 21 to 26 are examples of first to sixth valves.

FIG. 1 further illustrates, as gas flow paths through which a gas is fed, flow paths P1 to P4 and flow paths P11 to P19.

The gas feeder 1 feeds the gas for processing a wafer. Examples of such a gas include a chemical vapor deposition (CVD) gas for forming a film on the wafer and a reactive ion etching (RIE) gas for etching the film on the wafer. Examples of the gas feeder 1 include a gas cylinder. The gas feeder 1 feeds the gas to the flow path P1.

The chamber 2 processes the wafer by using the gas from the gas feeder 1 and the like. Examples of the chamber 2 include a CVD chamber and an RIE chamber. The gas from the gas feeder 1 and the like is introduced to the chamber 2 through the flow path P2 and is discharged from the chamber 2 to the flow path P3.

The pump 3 is provided to the flow path P3 so as to discharge the gas from the chamber 2. The flow path P2 and the flow path P3 are connected to the flow path P4 to bypass the chamber 2.

The first MFC 4 is disposed between the flow path P1 and the flow path P2. As illustrated in FIG. 1, the first MFC 4 is disposed downstream from the gas feeder 1, and is disposed upstream from the chamber 2, the first tank 6, and the second tank 7. The first MFC 4 has a function for measuring the mass flow rate of the gas from the gas feeder 1 and a function for controlling the mass flow rate of the gas from the gas feeder 1. The first MFC 4 may output the measured flow rate to the controller 10.

The second MFC 5 is disposed between the flow path P15 and the flow path P16. As illustrated in FIG. 1, the second MFC 5 is disposed downstream from the first tank 6 and the second tank 7, and is disposed upstream from the chamber 2. The second MFC 5 has a function for measuring the mass flow rate of the gas from the first tank 6 or the second tank 7 and a function for controlling the mass flow rate of the gas from the first tank 6 and the second tank 7. The second MFC 5 may output the measured mass flow rate to the controller 10.

The first tank 6 stores the gas from the gas feeder 1, and feeds the stored the gas to the chamber 2. Accordingly, the chamber 2 can process the wafer by using the gas from the first tank 6. The first tank 6 also can feed (transfer) the stored the gas to the second tank 7. The gas from the gas feeder 1 is introduced to the first tank 6 through the flow path P11, and is discharged from the first tank 6 to the flow path P13. The flow path P11 is connected to the flow path P4. Further, the gas from the second tank 7 is introduced to the first tank 6 via the flow paths P14, P15, P16, P17, and P11. The flow path P19 is connected to the flow paths P16, P17, and P2.

The second tank 7 stores the gas from the gas feeder 1, and feeds the stored the gas to the chamber 2. Accordingly, the chamber 2 can process the wafer by using the gas from the second tank 7. The second tank 7 also can feed (transfer) the stored the gas to the first tank 6. The gas from the gas feeder 1 is introduced to the second tank 7 through the flow path P12 and is discharged from the second tank 7 to the flow path P14. The flow path P12 is connected to the flow path P4. Furthermore, the gas from the first tank 6 is introduced to the second tank 7 via the flow paths P13, P15, P16, P18, and P12. The flow path P19 is connected to the flow paths P16, P18, and P2.

The first measuring instrument 8 measures the physical quantity of the gas in the first tank 6, for example, measures the pressure of the gas in the first tank 6. The first measuring instrument 8 outputs the measured physical quantity to the controller 10.

The second measuring instrument 9 measures the physical quantity of the gas in the second tank 7, for example, measures the pressure of the gas in the second tank 7. The second measuring instrument 9 outputs the measured physical quantity to the controller 10.

The controller 10 controls various operations of the semiconductor manufacturing apparatus. For example, the controller 10 controls an operation of the chamber 2, an operation of the pump 3, opening and closing of the valves 11 to 14, opening and closing of the valves 21 to 27, and the like. Examples of the controller 10 include a processor, an electric circuit, and a computer.

The first feeding valve 11 is provided on the flow path P1. The second feeding valve 12 and the third feeding valve 13 are provided on the flow path P2. The bypass valve 14 is provided on the flow path P4. At a point between the first MFC 4 and the second feeding valve 12, the flow path P4 is connected to the flow path P2. Also, at a point between the second feeding valve 12 and the third feeding valve 13, the flow path P19 is connected to the flow path P2.

The first inlet valve 21, the second inlet valve 22, the first outlet valve 23, and the second outlet valve 24 are provided on the flow paths P11, P12, P13, and P14, respectively. The first transfer valve 25 and the second transfer valve 26 are provided on the flow paths P17 and P18, respectively. The introduction valve 27 is provided on the flow path P19. At points upstream from the bypass valve 14, the flow paths P11 and P12 are connected to the flow path P4.

By controlling the valves 11 to 27 and the like, the controller 10 controls feeding of the gas to the first tank 6, the second tank 7, and the chamber 2.

For example, the controller 10 controls a first process of feeding the gas from the gas feeder 1 to the first tank 6, a second process of feeding the gas from the gas feeder 1 to the second tank 7, a third process of feeding the gas from the first tank 6 to the chamber 2, and a fourth process of feeding the gas from the second tank 7 to the chamber 2. By controlling the valves 21 to 24 and the like, the controller 10 can control the first to fourth processes. For example, during execution of the first process, the first inlet valve 21 is opened.

The controller 10 further controls a fifth process of feeding the gas from the second tank 7 to the first tank 6 and a sixth process of feeding the gas from the first tank 6 to the second tank 7. By controlling the valves 25 and 26 and the like, the controller 10 can control the fifth and sixth processes. For example, during execution of the fifth process, the first transfer valve 25 and the second outlet valve 24 are opened.

The controller 10 further controls a seventh process of feeding the gas from the gas feeder 1 to the chamber 2 via neither of the first and second tanks 6, 7. By controlling the valves 11 to 13 and the like, the controller 10 can control the seventh process. For example, during execution of the seventh process, the first to third feeding valves 11 to 13 are opened.

The controller 10 of the present embodiment operates such that two or more of the first to seventh processes are not executed simultaneously. For example, when the first process is being executed, any of the second to seventh processes is not performed. An example of the order of executing the first to seventh processes is described later with reference to FIGS. 2A to 5B.

The controller 10 receives, from the first measuring instrument 8, the measurement result of the pressure of the gas in the first tank 6, receives, from the second measuring instrument 9, the measurement result of the pressure of the gas in the second tank 7, and monitors the pressures. The controller 10 controls feeding of the gas to the first tank 6, the second tank 7, and the chamber 2 in accordance with the pressures.

During the feeding of the gas from the gas feeder 1 or the first tank 6 to the second tank 7, the controller 10 monitors the pressure of the gas in the first tank 6, for example. In this case, when the pressure of the gas in the first tank 6 reaches a predetermined value, the feeding of the gas to the first tank 6 is stopped. The predetermined value is set to 66.7 kPa, for example. Thereafter, the controller 10 feeds the gas from the gas feeder 1 or the second tank 7 to the first tank 6. In this way, the gas is fed to the first and second tanks 6, 7, alternately. The controller 10 may monitor any physical quantity other than the pressure, and use the physical quantity in controlling the feeding of the gas.

FIGS. 2A to 5B are diagrams illustrating operations of the semiconductor manufacturing apparatus of the first embodiment. In FIGS. 2A to 5B, white valves indicate opened valves and black valves indicate closed valves.

First, the valves 11, 21 are opened and the other valves are closed (FIG. 2A). At a step in FIG. 2A, in order to stabilize the first MFC 4, the gas is fed from the gas feeder 1 to the first tank 6 via the first MFC 4 (reference character A1). As a result, the gas is stored in the first tank 6 without being discharged wastefully. The step in FIG. 2A corresponds to the first process.

Next, the valves 11 to 13 are opened and the other valves are closed (FIG. 2B). At a step in FIG. 2B, the gas is fed from the gas feeder 1 to the chamber 2 via the first MFC 4, and the wafer in the chamber 2 is processed by use of the gas (reference character A2). The step in FIG. 2B corresponds to the seventh process.

Until the pressure in the first tank 6 reaches the predetermined value, the steps in FIGS. 2A and 2B are executed alternately. The step in FIG. 2A is executed to stabilize the first MFC 4, and the step in FIG. 2B is executed to process the wafer.

Figures 3A, 3B:
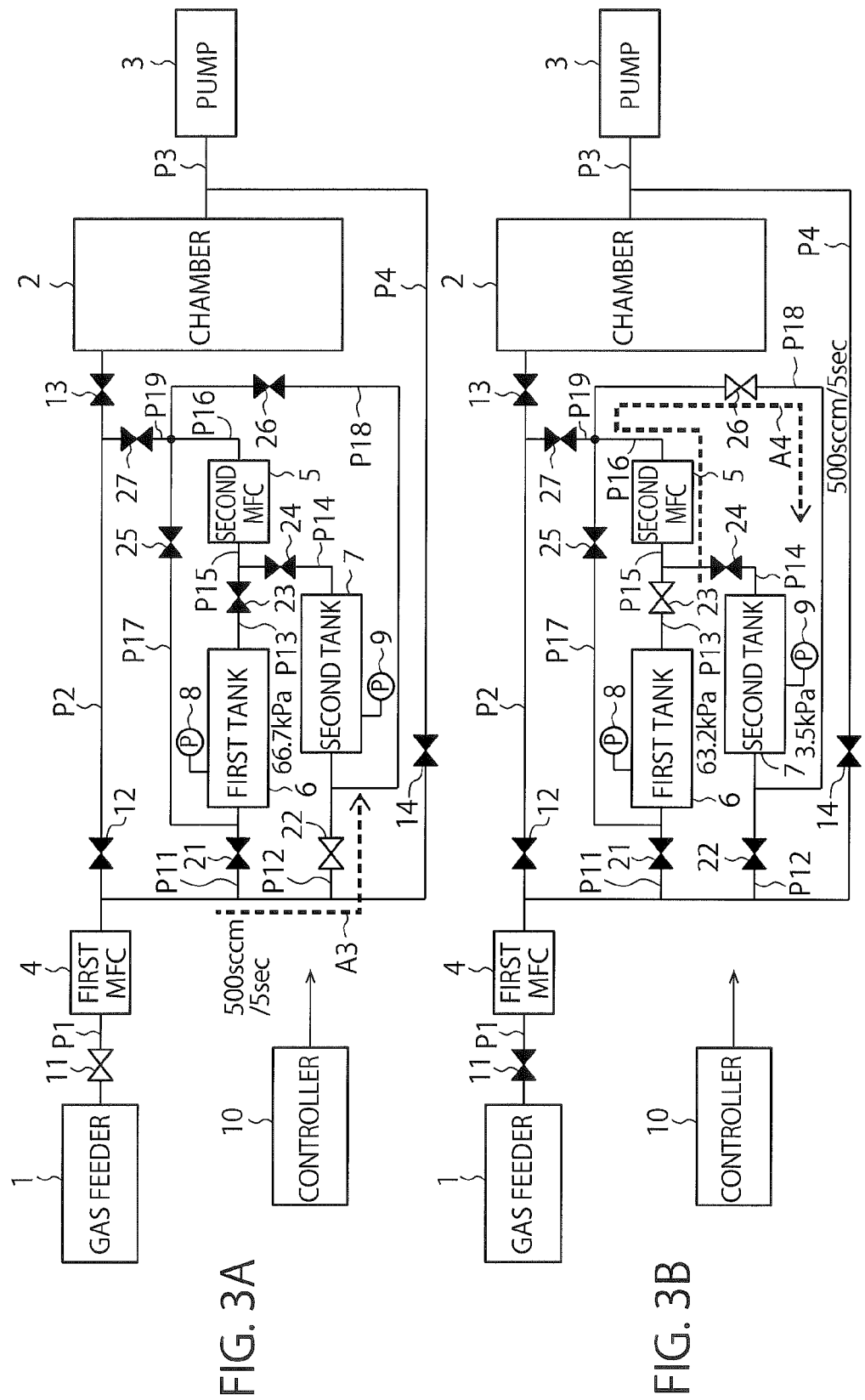

When the pressure in the first tank 6 reaches the predetermined value, the valves 11, 22 are opened and the other valves are closed (FIG. 3A). At a step in FIG. 3A, in order to stabilize the first MFC 4, the gas is fed from the gas feeder 1 to the second tank 7 via the first MFC 4 (reference character A3). As a result, the gas is stored in the second tank 7 without being discharged wastefully. The step in FIG. 3A corresponds to the second process. In this case, the step in FIG. 3A and the step in FIG. 2B may be executed alternately.

Next, the valves 23, 26 are opened and the other valves are closed (FIG. 3B). At a step in FIG. 3B, in order to stabilize the second MFC 5, the gas is fed from the first tank 6 to the second tank 7 via the second MFC 5 (reference character A4). As a result, the gas is transferred from the first tank 6 to the second tank 7 without being discharged wastefully. The step in FIG. 3B corresponds to the sixth process.

Next, the valves 13, 23, 27 are opened and the other valves are closed (FIG. 4A). At a step in FIG. 4A, the gas is fed from the first tank 6 to the chamber 2 via the second MFC 5 and the wafer in the chamber 2 is processed by use of the gas (reference character A5). The step in FIG. 4A corresponds to the third process.

Next, the valves 11, 22 are opened and the other valves are closed (FIG. 4B). At a step in FIG. 4B, in order to stabilize the first MFC 4, the gas is fed from the gas feeder 1 to the second tank 7 via the first MFC 4 (reference character A6). As a result, the gas is stored in the second tank 7 without being discharged wastefully. The step in FIG. 4B corresponds to the second process. In this case, until the pressure in the second tank 7 reaches the predetermined value, the step in FIG. 4B and the step in FIG. 2B may be executed alternately.

Figures 5A, 5B:
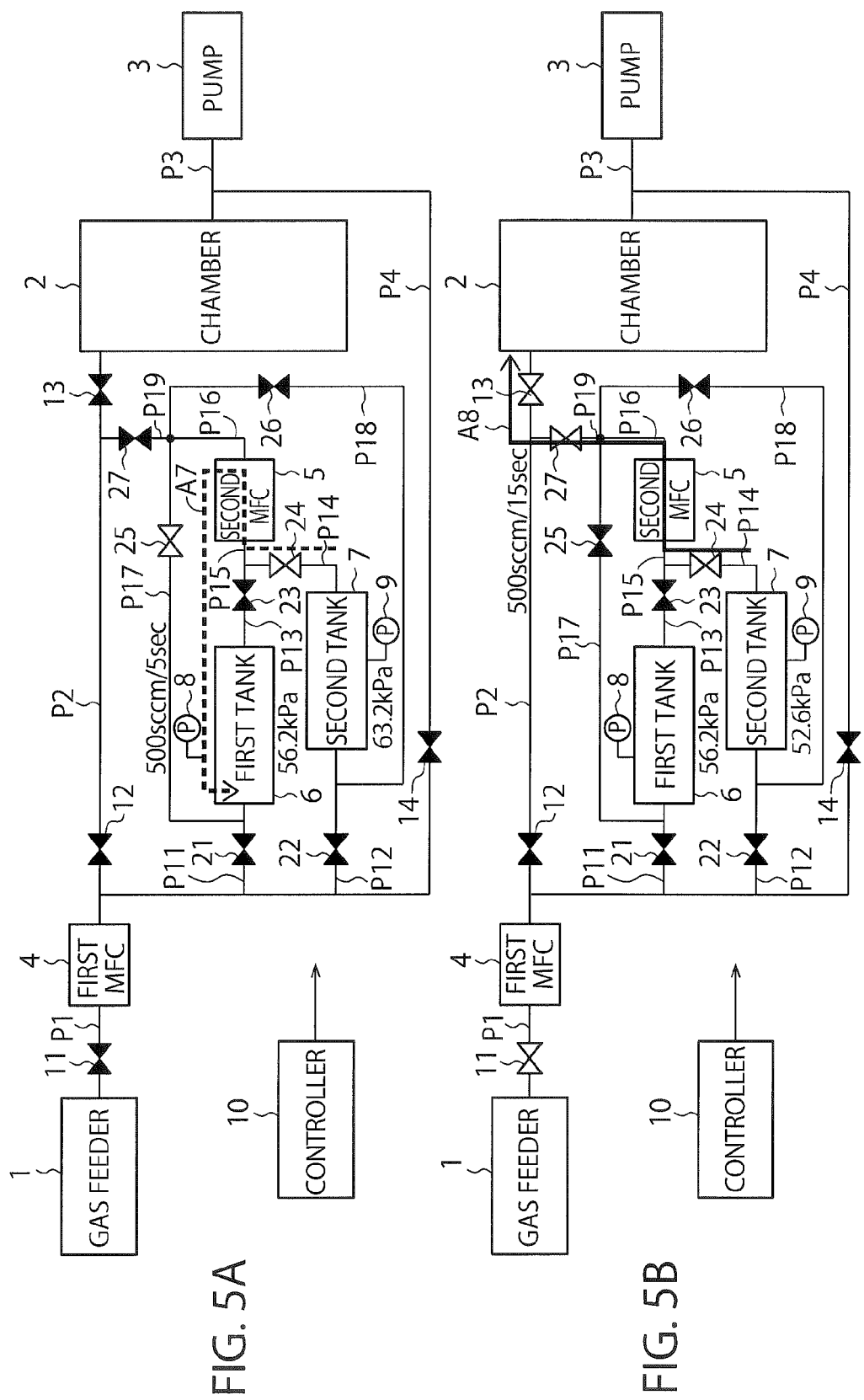

When the pressure in the second tank 7 reaches the predetermined value, the valves 24, 25 are opened and the other valves are closed (FIG. 5A). At a step in FIG. 5A, in order to stabilize the second MFC 5, the gas is fed from the second tank 7 to the first tank 6 via the second MFC 5 (reference character A7). As a result, the gas is transferred from the second tank 7 to the first tank 6 without being discharged wastefully. The step in FIG. 5A corresponds to the fifth process.

Next, the valves 13, 24, 27 are opened and the other valves are closed (FIG. 5B). At a step in FIG. 5B, the gas is fed from the second tank 7 to the chamber 2 via the second MFC 5 and the wafer in the chamber 2 is processed by use of the gas (reference character A8). The step in FIG. 5B corresponds to the fourth process.

Thereafter, the same steps are repeatedly executed in the present embodiment. In this way, a semiconductor device can be manufactured from the wafer.

As described above, the semiconductor manufacturing apparatus of the present embodiment includes the first tank 6 and the second tank 7 in which the gas from the gas feeder 1 is stored. The chamber 2 processes the wafer by using the gas from the gas feeder 1 and the first tank 6 or the second tank 7. Consequently, according to the present embodiment, the first and second MFCs 4, 5 can be stabilized without involving wasteful discharge of the gas.

A method of manufacturing a semiconductor device according to the present embodiment is effective in a case where an expensive gas or a rare gas is used, for example. Examples of such a gas include a tungsten-containing gas, a boron-containing gas and a source gas for high-k insulators.

At the step in FIG. 3B, the semiconductor manufacturing apparatus of the present embodiment transfers the gas from the first tank 6 to the second tank 7. During the transferring, the gas in the first tank 6 is transferred to the second tank 7 due to the pressure difference between the first tank 6 and the second tank 7. Consequently, according to the present embodiment, such transferring can be performed without use of a pump. The same applies to the step in FIG. 5A.

The volumes of the first and second tanks 6, 7 may be equal to or different from each other. However, when the volumes of the first and second tanks 6, 7 are equal to each other, the aforementioned pressure difference is easily generated. For this reason, the volumes of the first and second tanks 6, 7 are set to be equal to each other in the present embodiment.

The semiconductor manufacturing apparatus of the present embodiment may include three or more tanks between the gas feeder 1 and the chamber 2. The tanks can be used by a method the same as that for the first and second tanks 6, 7. For example, the gas may be sequentially fed to the three or more tanks in a manner the same as that in which the gas is fed to the first and second tanks 6, 7 alternately. The semiconductor manufacturing apparatus including the three or more tanks is effective in a case where the gas needs to be fed at a large flow rate to the chamber 2, for example.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
   a first tank and a second tank configured to store a gas fed from a gas feeder;
   a chamber configured to process a wafer by using the gas fed from the gas feeder, the first tank, or the second tank;
   a gas flow path configured to feed the gas from the gas feeder to the chamber via neither of the first tank and the second tank;
   a first flow path configured to feed the gas from the gas flow path to the first tank;
   a second flow path configured to feed the gas from the gas flow path to the second tank;
   a third flow path configured to feed the gas from the first tank to the gas flow path;
   a fourth flow path configured to feed the gas from the second tank to the gas flow path; and
   a controller configured to control feeding of the gas to the first tank, the second tank, and the chamber, wherein the controller controls:
   a gas feeding process of feeding the gas from the gas feeder to the chamber via neither of the first tank and the second tank and via the gas flow path,
   a first process of feeding the gas from the gas feeder to the first tank via the first flow path,
   a second process of feeding the gas from the gas feeder to the second tank via the second flow path,
   a third process of feeding the gas from the first tank to the chamber via the third flow path, and
   a fourth process of feeding the gas from the second tank to the chamber via the fourth flow path.

2. The apparatus of claim 1, further comprising:
   a first measuring instrument configured to measure a physical quantity of the gas in the first tank; and
   a second measuring instrument configured to measure a physical quantity of the gas in the second tank,
   wherein the controller controls the feeding of the gas to the first tank, the second tank, and the chamber in accordance with the physical quantities measured by the first and second measuring instruments.

3. The apparatus of claim 1, wherein the controller operates such that two or more of the gas feeding process, the first process, the second process, the third process, and the fourth process are not executed simultaneously.

4. The apparatus of claim 1, further comprising:
   a first valve provided between the gas feeder and the first tank;
   a second valve provided between the gas feeder and the second tank;
   a third valve provided between the first tank and the chamber; and
   a fourth valve provided between the second tank and the chamber, wherein
   the first, second, third, and fourth valves are provided on the first, second, third, and fourth flow paths, respectively, and
   the controller controls the first to fourth processes by controlling the first to fourth valves.

5. The apparatus of claim 1, wherein the controller controls:
a fifth process of feeding the gas from the second tank to the first tank, and
a sixth process of feeding the gas from the first tank to the second tank.

6. The apparatus of claim 5, further comprising:
a fifth valve configured to feed the gas from the second tank to the first tank; and
a sixth valve configured to feed the gas from the first tank to the second tank,
wherein the controller controls the fifth and sixth processes by controlling the fifth and sixth valves.

7. The apparatus of claim 5, wherein the controller operates such that two or more of the gas feeding process, the first process, the second process, the third process, the fourth process, the fifth process, and the sixth process are not executed simultaneously.

8. The apparatus of claim 1, further comprising a seventh valve configured to feed the gas from the first tank and the gas from the second tank to the chamber.

9. The apparatus of claim 1, further comprising:
a first flow rate controller provided between the gas feeder and the first tank and the second tank; and
a second flow rate controller provided between the first tank and the second tank and the chamber.

10. A semiconductor manufacturing apparatus comprising:
a first tank and a second tank configured to store a gas fed from a gas feeder;
a chamber configured to process a wafer by using the gas fed from the gas feeder, the first tank, or the second tank;
a first flow rate controller provided between the gas feeder and the first and second tanks;
a second flow rate controller provided between the first and second tanks and the chamber;
a first flow path configured to feed the gas from the first flow rate controller to the first tank;
a second flow path configured to feed the gas from the first flow rate controller to the second tank;
a third flow path configured to feed the gas from the first tank to the second flow rate controller;
a fourth flow path configured to feed the gas from the second tank to the second flow rate controller;
a fifth flow path configured to feed the gas from the second flow rate controller to the first tank;
a sixth flow path configured to feed the gas from the second flow rate controller to the second tank; and
a controller configured to control feeding of the gas to the first tank, the second tank, and the chamber, wherein the controller controls:
a first process of feeding the gas from the gas feeder to the first tank via the first flow path,
a second process of feeding the gas from the gas feeder to the second tank via the second flow path,
a third process of feeding the gas from the first tank to the chamber via the third flow path,
a fourth process of feeding the gas from the second tank to the chamber via the fourth flow path,
a fifth process of feeding the gas from the second tank to the first tank, and
a sixth process of feeding the gas from the first tank to the second tank.

* * * * *